(12) United States Patent
Kim et al.

(10) Patent No.: US 7,105,475 B2
(45) Date of Patent: Sep. 12, 2006

(54) CLEANING SOLUTION AND CLEANING METHOD OF A SEMICONDUCTOR DEVICE

(75) Inventors: Sang-Yong Kim, Yongin-si (KR); Sang-Jun Choi, Seoul (KR); Chang-Ki Hong, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/859,815

(22) Filed: Jun. 3, 2004

(65) Prior Publication Data

US 2004/0244823 A1 Dec. 9, 2004

(30) Foreign Application Priority Data

Jun. 4, 2003 (KR) .................... 10-2003-0036090

(51) Int. Cl.
*C11D 1/00* (2006.01)
*C11D 3/02* (2006.01)
*C11D 3/24* (2006.01)
*C11D 3/20* (2006.01)

(52) U.S. Cl. ............... 510/176; 510/175; 510/257; 510/477; 510/488; 510/499; 438/692

(58) Field of Classification Search ............. 510/175, 510/176, 253, 257, 478, 488, 467, 499; 438/692
See application file for complete search history.

(56) References Cited

U.S. PATENT DOCUMENTS 5,258,093 A * 11/1993 Maniar .................... 438/3
5,972,862 A * 10/1999 Torii et al. .................... 510/175
6,194,365 B1 * 2/2001 Lee ............................ 510/175
6,200,947 B1 * 3/2001 Takashima et al. ......... 510/402
6,245,158 B1 * 6/2001 Verhaverbeke ............... 134/10
6,261,845 B1 * 7/2001 Verhaverbeke et al. ....... 436/55
6,296,714 B1 * 10/2001 Matsuo et al. ................. 134/2
6,453,914 B1 * 9/2002 Torek et al. ................. 134/1.2
6,468,357 B1 * 10/2002 Aoki et al. .................... 134/3
6,517,738 B1 * 2/2003 Torek et al. ............... 252/79.1
6,562,726 B1 * 5/2003 Torek et al. ................. 438/745
2004/0224866 A1 * 11/2004 Matsunaga et al. ......... 510/175
2004/0242446 A1 * 12/2004 Mun et al. ................... 510/175

FOREIGN PATENT DOCUMENTS

JP         09-246223       9/1997
KR         10-125642       5/1998

OTHER PUBLICATIONS

* Patent Abstracts of Japan for Publication No. 10-125642.

* cited by examiner

*Primary Examiner*—Gregory R. Del Cotto
(74) *Attorney, Agent, or Firm*—F. Chau & Associates, LLC

(57) ABSTRACT

A cleaning method for removing foreign bodies during the fabrication of semiconductor devices including treating a substrate with a cleaning solution including an oxidizer to form a chemical oxide layer and then removing the chemical oxide layer, thereby removing foreign bodies from a surface of the semiconductor substrate. Accordingly, the foreign bodies can be substantially removed from the surface of the substrate without corroding a metal.

12 Claims, 4 Drawing Sheets

CLEANING SOLUTION AND CLEANING METHOD OF A SEMICONDUCTOR DEVICE

FIELD OF THE INVENTION

The present invention relates, generally, to cleaning solutions and cleaning methods of semiconductor devices, more particularly, to cleaning solutions capable of removing foreign bodies without corroding metals used in fabricating semiconductor devices, and cleaning methods using the cleaning solutions.

BACKGROUND OF THE INVENTION

Generally, a semiconductor manufacturing process comprises unit processes such as a thin film process for forming a dielectric layer and a conductive layer on a semiconductor substrate, a photolithographic process for patterning the dielectric layer and conductive layer to a desired pattern, a contact window process for connecting conductive material layers (or patterns) to each other, a chemical mechanical polishing (CMP) process for planarizing surfaces of the material layers, etc.

During the manufacturing processes, undesirable foreign bodies, e.g., small particles, metal impurities and organic contaminants, etc, may remain on the surfaces of material layers, thereby causing problems in subsequent processes or in a manufactured device. For instance, the foreign bodies remaining on an interface between conductive material layers may deteriorate contact resistance characteristics of the manufactured device. In addition, if an upper material layer is formed on a lower material layer with foreign bodies on a surface thereof, the upper material layer may exhibit bad step coverage, an irregular surface, or poor growth. Therefore, a cleaning process is performed to remove foreign bodies on a material layer between the unit processes.

SCI is a conventional cleaning solution used in semiconductor manufacturing and includes a mixture of hydrogen peroxide ($H_2O_2$), ammonium hydroxide ($NH_4OH$) and deionized water. Although SCI does not cause particular problems to polysilicon, silicon nitride, and oxide, SCI contains hydrogen peroxide that causes problems to metals used in fabricating semiconductor devices because hydrogen peroxide is a strong oxidizer. For instance, the hydrogen peroxide corrodes various metals used in processes for fabricating semiconductor devices and has a disadvantage of requiring a high temperature for cleaning.

Therefore, a need exists for cleaning solutions that are capable of removing foreign bodies without corroding metals used in semiconductor fabrication, and cleaning methods using the cleaning solutions.

SUMMARY OF THE INVENTION

Exemplary Embodiments of the present invention provide cleaning solutions that are capable of removing foreign bodies without corroding a metal, and cleaning methods using the cleaning solutions.

According to an exemplary embodiment of the present invention, a cleaning solution includes an oxidizer, deionized water, a fluorine based deoxidizer and a surface charge controlling agent.

According to another exemplary embodiment, an oxidizer of a cleaning solution serves to form a chemical oxide layer on a surface of a target layer to be cleaned. A fluorine based deoxidizer of the cleaning solution serves to remove the chemical oxide layer formed by the oxidizer. Therefore, when a substrate with a material layer having foreign bodies is treated with the cleaning solution, the surface of the material layer is oxidized by the oxidizer to form the chemical oxide layer. Simultaneously, the chemical oxide layer formed by the oxidizer is removed by the fluorine based deoxidizer. In this case, by oxidizing the surface of the material layer, the foreign bodies that were on the surface of the material layer are now located on the chemical oxide layer. Accordingly, the foreign bodies are removed while the chemical oxide layer is removed.

According to another exemplary embodiment, a surface charge controlling agent of the cleaning solution changes a surface potential (i.e., a zeta potential) of particles, or foreign bodies, removed from the surface of the material layer. For example, the surface charge controlling agent changes the zeta potentials of the material layer and the foreign bodies removed from the material layer to be either a strong negative or a strong positive zeta potential, thereby generating an electrical repulsive force between the removed foreign bodies and the material layer. Therefore, the surface charge controlling agent prevents the foreign bodies removed from the surface of the material layer from being re-adsorbed on the surface of the material layer such that the foreign bodies are completely removed from the material layer.

According to another exemplary embodiment, the fluorine based deoxidizer has a high etch selectivity with respect to oxide layers, e.g., a metal oxide and a silicon oxide.

According to another exemplary embodiment, the oxidizer in the cleaning solution does not corrode metals. Accordingly, the foreign bodies can be removed without erosion of a metal.

According to another exemplary embodiment of the present invention, a cleaning solution includes about 0.01 wt % of a surface charge controlling agent, about 10 wt % of a fluorine based deoxidizer and about 5 wt % of an oxidizer.

According to another exemplary embodiment, the fluorine based deoxidizer includes hydrofluoric acid, hydroboron tetrafluoric acid, ammonium fluoride or any combination thereof.

According to another exemplary embodiment of the present invention, the oxidizer includes an iodine based oxidizer, nitric acid, phosphoric acid or any combination thereof. Further, the iodine based oxidizer includes ammonium iodine oxide, potassium iodine oxide, lithium iodine oxide, calcium iodine oxide, barium iodine oxide, potassium iodine, ammonium iodine or any combination thereof.

According to another exemplary embodiment, the surface charge controlling agent includes an organic acid, a surfactant or any combination thereof. The organic acid includes citric acid, a tricarboxylic acid, tartaric acid, succinic acid, malic acid, aspartic acid, glutaric acid, adipic acid, suberic acid, oxalic acid, acetic acid, fumaric acid or any combination thereof.

According to another exemplary embodiment, the surfactant includes a negative ion surfactant or a positive ion surfactant. The negative ion surfactant or the positive ion surfactant is adsorbed on surfaces of the particles and changes the zeta potential of the particles.

According to another exemplary embodiment, the above cleaning solution substantially removes foreign bodies from a surface of the material layers formed in the processes for fabricating semiconductor devices, such as a metal layer, a metal nitride layer, a polysilicon layer or a metal silicide layer.

According to another exemplary embodiment, the cleaning solution of the present invention may be used in cleaning methods to remove not only the foreign bodies occurring in processes for fabricating semiconductor devices but to also remove foreign bodies on a surface of a metal.

According to still another exemplary embodiment of the present invention, a cleaning method comprises the step of treating a substrate with a cleaning solution including an oxidizer, deionized water, a fluorine based deoxidizer, and a surface charge controlling agent. Further, a surface of the substrate is oxidized by the oxidizer to form a chemical oxide layer, and the chemical oxide layer is removed by the fluorine based deoxidizer at the same time. Accordingly, foreign bodies are removed from the surface of the substrate. Strong electric repulsive forces are generated between surfaces of the removed foreign bodies and the substrate due to the surface charge controlling agent.

According to another exemplary embodiment the present invention, a cleaning method comprises oxidizing a substrate to form an oxide layer on a surface thereof and then removing the oxide layer.

In another exemplary embodiment, the forming of the oxide layer comprises treating the substrate with a solution including an oxidizer.

In another exemplary embodiment, removing the oxide layer comprises treating the substrate with a solution comprising a fluorine based deoxidizer, a surface charge controlling agent and deionized water.

According to still another exemplary embodiment of the present invention, a cleaning method comprises treating a substrate with a first solution comprising an oxidizer, rinsing the substrate with deionized water to remove the first solution comprising an oxidizer, drying the substrate, and treating the substrate with a second solution comprising a surface charge controlling agent, a fluorine based deoxidizer and a deionized water.

According to another exemplary embodiment, after treating the substrate with the second solution, the substrate may be treated with the first solution comprising the oxidizer, rinsed with deionized water to remove the first solution and then dried.

These and other exemplary embodiments, features, aspects, and advantages of the present invention will be described and become apparent from the following detailed description of the exemplary embodiments when read in conjunction with the accompanying drawings.

DETAILED DESCRIPTION OF EXEMPLARY EMBODIMENTS

Figure 1:
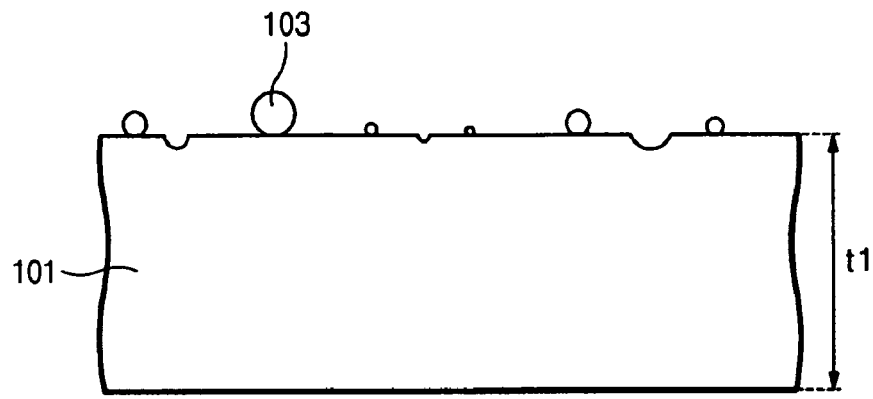
FIGS. 1 through 3 illustrate a cleaning method, according to an exemplary embodiment of the present invention.

The present invention will now be described more fully hereinafter with reference to the accompanying drawings, in which exemplary embodiments of the invention are shown. This invention may, however, be embodied in different forms and should not be constructed as limited to the exemplary embodiments set forth herein. Rather, these exemplary embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate or intervening layers may also be present.

In the specification, a "substrate" should be understood as any semiconductor substrate structure having a layer. For example, the substrate includes a substrate with an insulating layer (or an insulating pattern) and a conductive layer (or a conductive pattern), and a resultant structure of semiconductor substrate formed by a conventional photolithographic process. In addition, the substrate may refer to a metallic surface with a specific shape.

The present invention relates to cleaning solutions and cleaning methods used in processes for fabricating semiconductor devices. The cleaning solutions and the cleaning methods may also be applied to cleaning a metallic surface.

Figure 2:
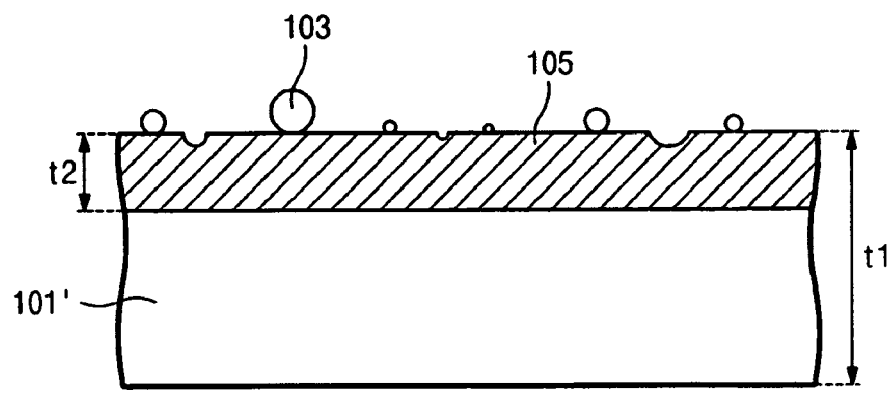
Figure 3:
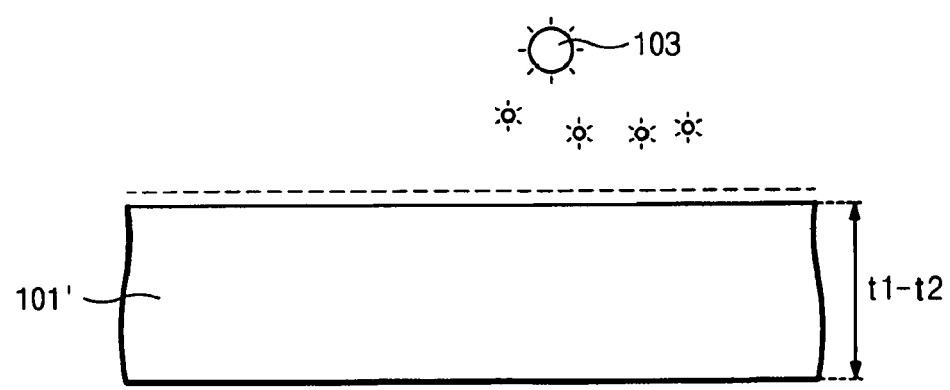

FIGS. 1 to 3 illustrates a cleaning method in accordance with an exemplary embodiment of the present invention. FIG. 1 is cross-sectional view showing foreign bodies 103, such as micro particles, metal foreign bodies and organic determinants, on a substrate 101. The substrate 101 may include various material layers formed in processes for fabricating semiconductors, for example, a metal interconnection, a polysilicon layer, a metal nitride layer, a metal silicide layer, etc.

Referring to FIG. 2, a surface of the substrate 101 is oxidized to form a chemical oxide layer 105 with a specific thickness (t2). Therefore, the foreign bodies 103 remain on the surface of the chemical oxide layer 105. The chemical oxide layer 105 is formed by an oxidizer. Preferably, the oxidizer is an iodine based oxidizer, nitric acid, phosphoric acid or any combination thereof. The iodine based oxidizer may include ammonium iodine oxide ($NH_4IO_3$), potassium iodine oxide ($KIO_3$), lithium iodine oxide ($LiIO_3$), calcium iodine oxide ($CaIO_3$), barium iodine oxide ($BaIO_3$), potassium iodine (KI), ammonium iodine ($NH_4I$) or any combination thereof.

In a case where the substrate 101 is polysilicon, the iodine based oxidizer forms a silicon oxide layer ($SiO_x$) on a surface of the polysilicon substrate as a thin protection layer, for example, a silicon dioxide ($SiO_2$) layer. In a case where the substrate 101 is tungsten, the iodine based oxidizer reacts with the tungsten substrate to form a stable tungsten trioxide ($WO_3$) layer on the surface of the tungsten substrate, wherein the stable tungsten trioxide ($WO_3$) layer acts as a thin protection layer.

Referring to FIG. 3, the chemical oxide layer 105 is etched using a fluorine based deoxidizer. The fluorine based deoxidizer may include hydrofluoric acid (HF), boron hydroboron tetrafluoric acid ($HBF_4$), ammonium fluoride ($NH_4F$) or any combination thereof. In addition, as the fluorine based deoxidizer etches the chemical oxide layer 105, the foreign bodies 103 remaining on the chemical oxide layer 105 are removed from a surface of the substrate 101'.

Surface polarities of the removed foreign bodies 103 and the substrate 101' are the same, for example, strong negative or strong positive. Therefore, a strong electrical repulsive force is generated between the surfaces thereof. As a result, re-adsorption of the foreign bodies 103 on the surface of the substrate 101' is prevented. The repulsive force between the surfaces of the substrate 101' and the foreign bodies 103 is created by a surface charge controlling agent. The surface charge controlling agent may change a zeta potential of a particle surface. Preferably, the surface charge controlling agent is an organic acid, a surfactant or any combination thereof. The organic acid dissociates in an aqueous solution and adsorbs on the surface of the particles (a substrate or a surface of the foreign contaminant) to change the zeta potential of the surface to a strong negative zeta potential. The surfactant comprises a surfactant with a polarity, e.g., a negative ion surfactant or a positive ion surfactant. The surfactant changes the zeta potential of the particles by being adsorbed on the surface of the particles. Preferably, the organic acid includes, for instance, citric acid, a tricarboxylic acid, tartaric acid, succinic acid, malic acid, aspartic acid, glutaric acid, adipic acid, suberic acid, oxalic acid, acetic acid, fumaric acid or any combination thereof.

According to an exemplary embodiment of the present invention, a cleaning solution comprises an oxidant, deionized water, a surfactant including fluoride and a surface charge controlling agent. It will be evident to those skilled in the art that the weight percentage (wt %) of components composing the cleaning solution can be properly adjusted within the scope of the invention. For example, an exemplary embodiment of the present invention may include about 0.01 wt % of a surface charge controlling agent, about 10 wt % of a reducer, and about 5 wt % of an oxidizer.

According to another exemplary embodiment, a semiconductor substrate 101 is treated with a cleaning solution in accordance with exemplary embodiments of the present invention in a cleaning apparatus. The cleaning apparatus may be a spin type, a spray type, a rotating-spray type or a dip type.

It should be noted that the substrate 101 may include a thin film, wherein the thin film may be a metallic layer or a polysilicon layer. Preferably, the metallic layer includes a metal nitride, a metal silicide, or any of the metals used in semiconductor fabricating processes, e.g., tungsten, titanium, nickel, cobalt, copper, aluminum, etc.

Preferably, the oxidizer included in the cleaning solution does not corrode a metal. For example, the oxidizer includes an iodine based oxidizer, nitric acid, phosphoric acid, or any combination thereof. The iodine based oxidizer is ammonium iodine oxide ($NH_4IO_3$), potassium iodine oxide ($KIO_3$), lithium iodine oxide ($LiIO_3$), calcium iodine oxide ($CaIO_3$), barium iodine oxide ($BaIO_3$), potassium iodine (KI), ammonium iodine ($NH_4I$) or any combination thereof. The surface of the substrate 101, or thin film, is oxidized by the oxidizer to form a chemical oxide layer 105. That is, a partial thickness t2 of the substrate 101, or thin film, is replaced by the chemical oxide layer 105. Therefore, foreign bodies 103 remaining on the surface of the substrate 101 are now located on a surface of the chemical oxide layer 105.

The fluorine based deoxidizer selectively removes the chemical oxide layer 105. Preferably, the fluorine based deoxidizer is hydrofluoric acid (HF), boron hydroboron tetrafluoric acid ($HBF_4$), ammonium fluoride ($NH_4F$) or any combination thereof. The fluorine based deoxidizer etches the chemical oxide layer 105 such that the foreign bodies 103 remaining on the chemical oxide layer 105 are removed from the surface of the substrate 101' while the chemical oxide layer 105 is etched.

The surface charge controlling agent prevents the removed foreign bodies 103 from re-adsorbing on the substrate 101'. That is, the surface charge controlling agent changes the surface charges of the substrate 101' and the removed foreign bodies 103 to the same polarity (i.e., a strong negative or strong positive polarity). Therefore, an electrical repulsive force is generated between the substrate 101' and the removed foreign bodies 103 that prevents the removed foreign bodies from being re-adsorbed on the surface of the substrate 101'. Preferably, the surface charge controlling agent is an organic acid, a surfactant or any combination thereof. The organic acid dissociates in aqueous solution to adsorb on the surface of a solid, e.g., the surfaces of a substrate or thin film and foreign bodies, to change the zeta potential of the solid to a strong negative.

Preferably, the organic acid includes, for example, citric acid, a tricarboxylic acid, tartaric acid, succinic acid, malic acid, aspartic acid, glutaric acid, adipic acid, suberic acid, oxalic acid, acetic acid, fumaric acid or any combination thereof.

The cleaning methods according to the above exemplary embodiments remove foreign bodies from a surface of a substrate or material layer and prevent the foreign bodies from re-adsorbing on the surface of the substrate or material layer, especially, from a surface of polysilicon.

According to another exemplary embodiment of the present invention, a first solution comprising an oxidizer and a fluorine based deoxidizer and a second solution comprising a surface charge controlling agent and deionized water are prepared. Preferably, the first solution may comprise about 5 wt % of the oxidizer, and the second solution may comprise about 0.01 wt % of the surface charge controlling agent and about 10 wt % of the fluorine based deoxidizer.

According to another embodiment, a semiconductor substrate 101, or a thin film, is treated with the first cleaning solution. As a result, a chemical oxide layer 105 is formed on the surface of the substrate 101, or thin film, by an oxidizer in the first solution. The chemical oxide layer 105 serves as an oxidation barrier layer. That is, chemical oxidation is blocked when the chemical oxide layer is thick enough to block the diffusion of oxygen. Preferably, the chemical oxide layer 105 is tens of angstrom thick.

Preferably, the oxidizer in the first solution does not corrode metals. For example, the oxidizer is an iodine based oxidizer, nitric acid, phosphoric acid or any combination thereof.

The iodine based oxidizer includes ammonium iodine oxide ($NH_4IO_3$), potassium iodine oxide ($KIO_3$), lithium iodine oxide ($LiIO_3$), calcium iodine oxide ($CaIO_3$), barium iodine oxide ($BaIO_3$), potassium iodine (KI), ammonium iodine ($NH_4I$) or any combination thereof.

Next, the substrate with the chemical oxide layer 105 is treated with the second solution. Therefore, while the fluorine based deoxidizer in the second solution etches the chemical oxide layer 105, foreign bodies 103 are removed from a surface of the substrate 101', or thin film. In addition, the surface charge controlling agent of the second solution adheres to the surfaces of the removed foreign particles 103 and the substrate 101', thereby causing the surfaces of the substrate 101' and the removed foreign bodies 103 to have the same polarity, e.g., a strong negative polarity. Thus, the foreign bodies 103 are prevented from re-adsorbing on the surfaces of the substrate.

Preferably, the substrate is rinsed with the deionized water to remove the first solution from the substrate before treating the substrate 101' with the second solution.

Similarly, after the substrate '101 is treated with the second solution, the substrate '101 is rinsed with deionized water to remove the second solution. Then, the substrate 101' is dried.

According to the above cleaning method, the foreign bodies can be removed from a substrate or thin film, e.g., a polysilicon substrate or a polysilicon thin film. In addition, the cleaning methods above can remove foreign bodies from a substrate or a thin film, in which the substrate or thin film comprises a metal, without corroding the metal.

According to another exemplary embodiment, the cleaning methods of the present invention may be used to clean a single wafer. That is, the substrate is treated with the first solution to form a chemical oxide layer, then rinsed with a deionized water to remove the first solution from the substrate, and then dried. Next, the substrate is treated with the second solution to remove the chemical oxide layer. The substrate is then rinsed with deionized water to remove the second solution and dried.

According to another exemplary embodiment of the present invention, the substrate may be treated with the first solution after treating the substrate with the second solution. As a result, the first solution may effectively prevent the formation of a water spot during a spin-dry process by making the surface of the substrate hydrophilic.

The above cleaning methods may be adapted to every process in the fabrication of a semiconductor device that requires a cleaning step. For instance, the cleaning methods may be used in a cleaning process performed after forming a tungsten or an aluminum interconnection, a cleaning process after forming a polysilicon gate or a metal gate including polysilicon and metal, a cleaning process after forming a contact window for connecting the lower to upper interconnections, or a cleaning process after a chemical mechanical process (CMP).

According to yet another exemplary embodiment of the present invention, FIGS. 4 through 8 illustrate a method for forming a metal interconnect using a cleaning method in accordance with an exemplary embodiment of the present invention.

Figure 4:
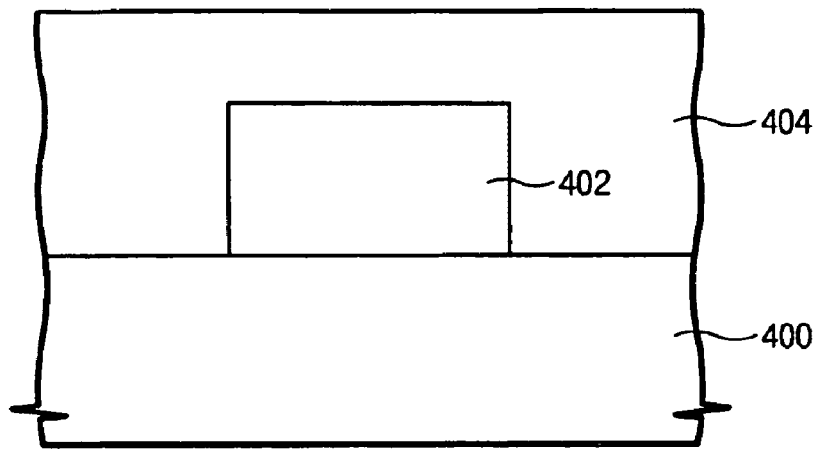
FIGS. 4 through 8 illustrate a metal interconnection process using a cleaning method, according to another exemplary embodiment of the present invention.

Referring to FIG. 4, a lower metal interconnection 402 is formed on a substrate 400. The lower metal interconnection 402 may be electrically connected to an active region of the substrate 400. For instance, the lower metal interconnection 402 may be formed by depositing a metal material and then patterning thereof. After the metal material is patterned, a cleaning process, in accordance with the exemplary embodiments of the present invention, is carried out to form a lower metal interconnection 402 with a clean surface.

Further, a dielectric layer 404 is formed on the lower metal interconnection 402 and the substrate 400. Preferably, the insulating layer 404 is a silicon oxide layer.

Figure 5:
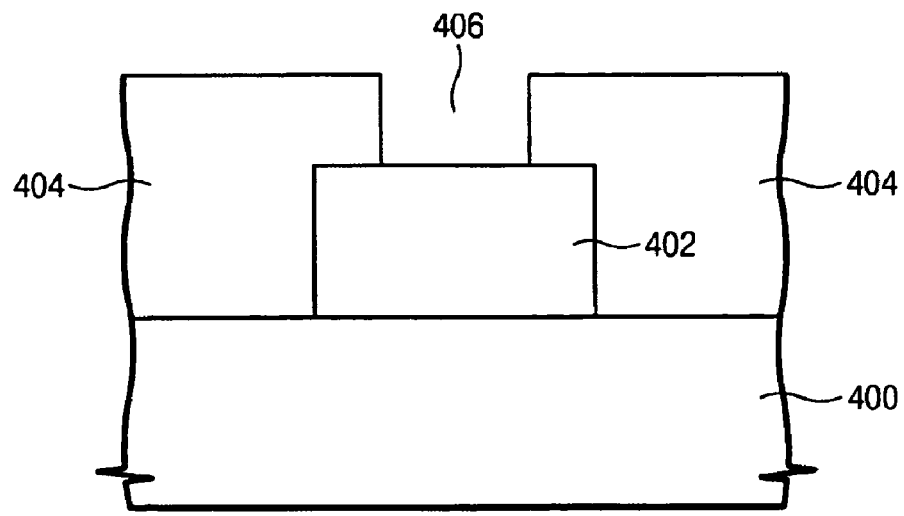

Referring to FIG. 5, the insulating layer 404 is patterned to form a contact window 406 exposing the lower metal interconnection 402 by a photolithographic process.

Figure 6:
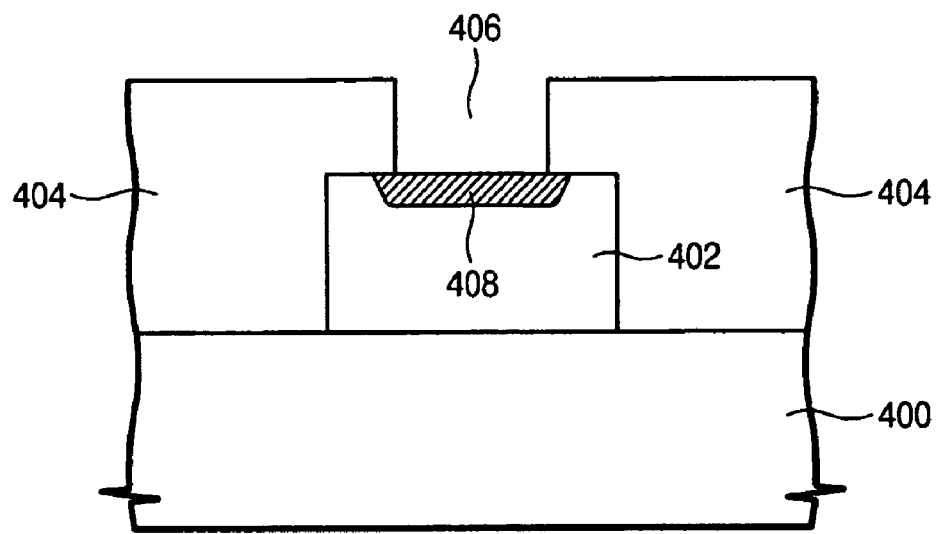

Referring to FIG. 6, using an aqueous solution comprising an oxidizer (a first solution), a metal oxide layer 408 is formed on the exposed lower metal interconnection 402. In this case, oxidation may occur not only on the exposed surface of the lower interconnection 402 but along a portion of the lower interconnection 402 not exposed and along a lower portion of sidewalls in the contact window 406 as well.

Figure 7:
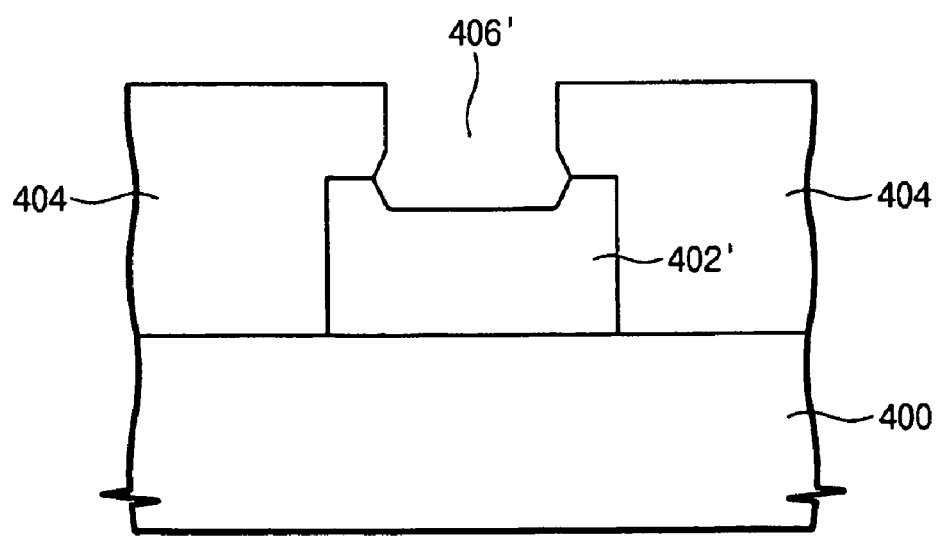

Referring to FIG. 7, a metal oxide layer 408 is removed using a second solution comprising a fluorine based deoxidizer, a surface charge controlling agent and deionized water. In a case where the dielectric layer 404 is an oxide layer, the dielectric layer 404 and the metal oxide layer 408 may be simultaneously etched. Therefore, a diameter and a bottom area of the contact window 406' increases, thereby improving the contact resistor characteristic between an upper metal interconnection, to be formed in a subsequent process, and the lower metal interconnection 402'.

Figure 8:
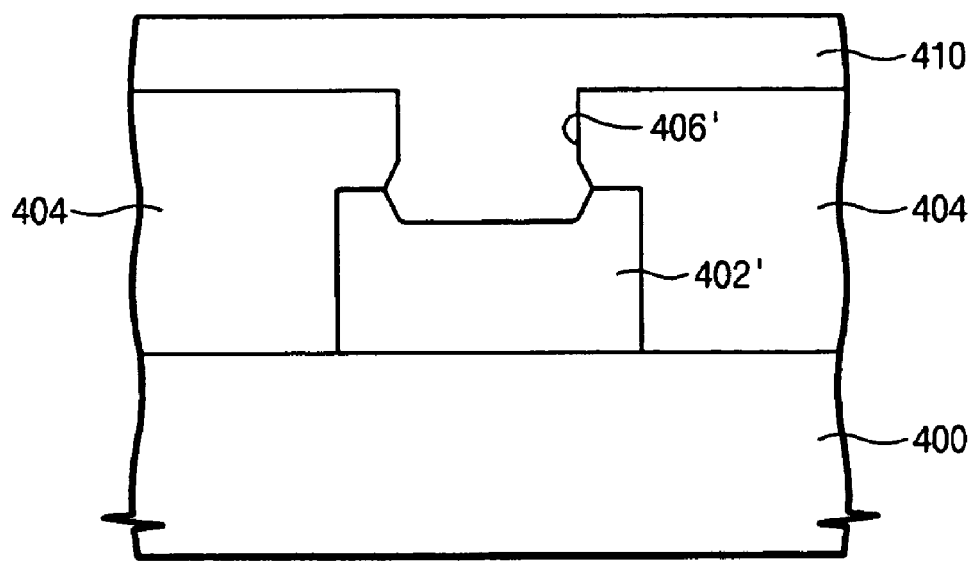

Referring to FIG. 8, a metal material is deposited on the dielectric layer 404 to fill the contact window 406'. The metal material is then patterned to form an upper metal interconnection 410.

The upper metal interconnection 410 is cleaned using a cleaning process in accordance with the exemplary embodiments of the present invention.

The cleaning solution of the present invention substantially removes foreign bodies from a metallic surface or a polysilicon surface without corroding a metal.

In addition, the cleaning solution of the present invention effectively cleans a metallic or polysilicon surface at room temperature.

While the present invention has been described in connection with specific and exemplary embodiments thereof, it will be understood by those of ordinary skill in the art that various changes in form and detail may be made therein without departing from the spirit and scope of the present invention as defined by the following claims.

What is claimed is:

1. A cleaning solution for removing foreign bodies from a substrate, the cleaning solution comprising:
   an iodine based oxidizer to form a chemical oxide layer on said substrate, said iodine based oxidizer is selected from the group consisting of ammonium iodine oxide, potassium iodine oxide, lithium iodine oxide, calcium iodine oxide, barium iodine oxide, potassium iodine, ammonium iodine and any combination thereof;
   deionized water;
   a fluorine based deoxidizer to remove said chemical oxide layer with said foreign bodies located thereon from said substrate; and
   a surface charge controlling agent.

2. The solution of claim 1, wherein the fluorine based deoxidizer is hydrofluoric acid, hydroboron tetrafluoric acid, ammonium fluoride or any combination thereof.

3. The solution of claim 1, wherein the surface charge controlling agent is an organic acid, an ionic surfactant or any combination thereof.

4. The solution of claim 3, wherein the organic acid is citric acid, a tricarboxylic acid, tartaric acid, succinic acid, malic acid, aspartic acid, glutaric acid, adipic acid, suberic acid, oxalic acid, acetic acid, fumaric acid or any combination thereof.

5. The solution of claim 1, wherein a surface of the substrate is formed of a metal, a metal nitride, a polysilicon or a metal silicide.

6. The solution of claim 1, wherein the fluorine based deoxidizer is hydrofluoric acid, hydroboron tetrafluoric acid, ammonium fluoride or any combination thereof, and
   wherein the surface charge controlling agent is an organic acid, an ionic surfactant or any combination thereof.

7. The solution of claim 6,
   wherein the organic acid is citric acid, a tricarboxylic acid, tartaric acid, succinic acid, malic acid, aspartic acid, glutaric acid, adipic acid, suberic acid, oxalic acid, acetic acid, fumaric acid or any combination thereof.

8. The solution of claim 7, wherein a surface of the substrate is formed of a metal, a metal nitride, a polysilicon or a metal silicide.

9. The solution of claim 1, wherein said surface charge controlling agent is present in an amount of about 0.01 wt %.

10. The solution of claim 1, wherein said fluorine based deoxidizer is present in an amount of about 10 wt %.

11. The solution of claim 1, wherein said oxidizer is present in an amount of about 5 wt %.

12. The solution of claim 1, wherein said surface charge controlling agent is present in an amount of about 0.01 wt %, said fluorine based deoxidizer is present in an amount of about 10 wt %, and said oxidizer is present in an amount of about 5 wt %.

* * * * *